United States Patent [19]

Grunes

[11] Patent Number: 5,556,248
[45] Date of Patent: *Sep. 17, 1996

[54] SEMICONDUCTOR WAFER CASSETTE TRANSFER SYSTEM

[75] Inventor: Howard E. Grunes, Santa Cruz, Calif.

[73] Assignee: Applied Materials, Inc., Santa Clara, Calif.

[*] Notice: The term of this patent shall not extend beyond the expiration date of Pat. No. 5,387,067.

[21] Appl. No.: 380,548

[22] Filed: Jan. 30, 1995

Related U.S. Application Data

[63] Continuation of Ser. No. 4,331, Jan. 14, 1993, Pat. No. 5,387,067.

[51] Int. Cl.⁶ .................................................. B65G 1/07
[52] U.S. Cl. ..................... 414/416; 414/937; 414/744.6; 118/500
[58] Field of Search ................................. 414/222, 225, 414/226, 217, 331, 935, 937, 939, 416, 403, 744.1, 744.2, 744.4, 744.5, 744.6; 118/719, 500; 204/298.25

[56] References Cited

U.S. PATENT DOCUMENTS

| | | | |
|---|---|---|---|
| 3,730,595 | 5/1973 | Yakubowski | 414/937 X |
| 4,828,224 | 5/1989 | Crabb et al. | 414/937 X |
| 4,923,054 | 5/1990 | Ohtani et al. | 414/937 X |
| 5,058,526 | 10/1991 | Matsushita et al. | 414/217 X |
| 5,340,261 | 8/1994 | Oosawa et al. | 414/937 X |

FOREIGN PATENT DOCUMENTS 1-06642  5/1987  Japan .................................... 414/937

*Primary Examiner*—Frank E. Werner
*Attorney, Agent, or Firm*—Craig P. Opperman

[57] ABSTRACT

A semiconductor cassette and transfer system for facilitating the direct loading and unloading of wafers from different sides of a cassette by a first robot handling device moveable along a first extension axis and second robot handling device moveable along a second extension axis intersecting said first extension axis at an acute angle, and at a predetermined point concurrent with the center of the cassette as it is disposed in a fixed position within a loadlock chamber of a wafer processing apparatus.

24 Claims, 3 Drawing Sheets

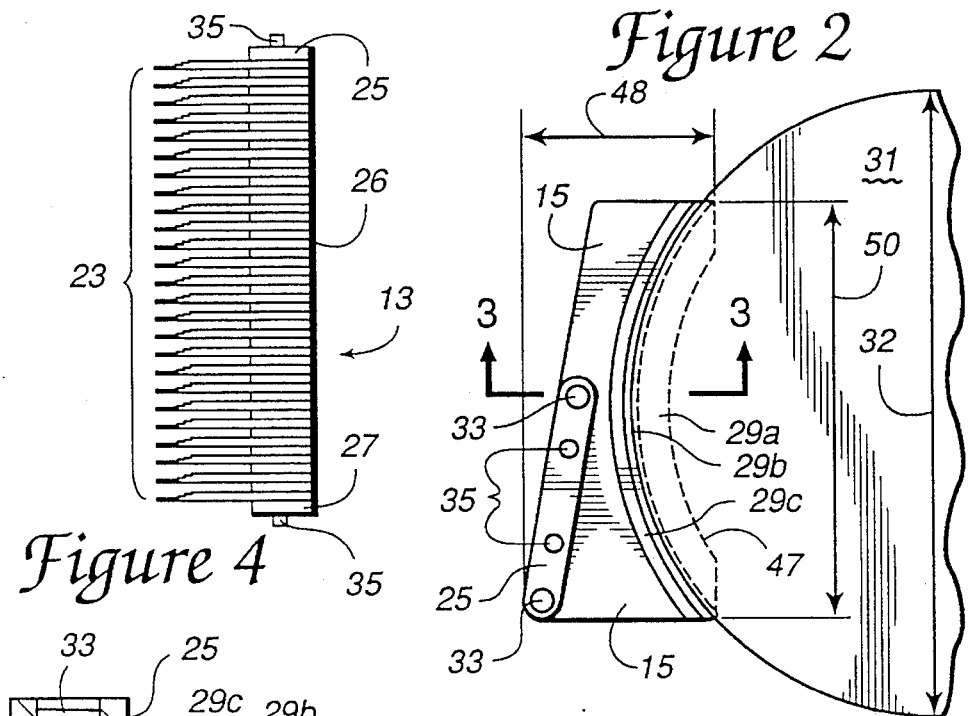
Figure 2
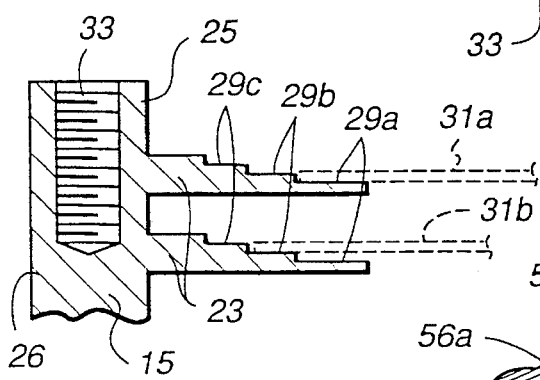
Figure 4
Figure 3
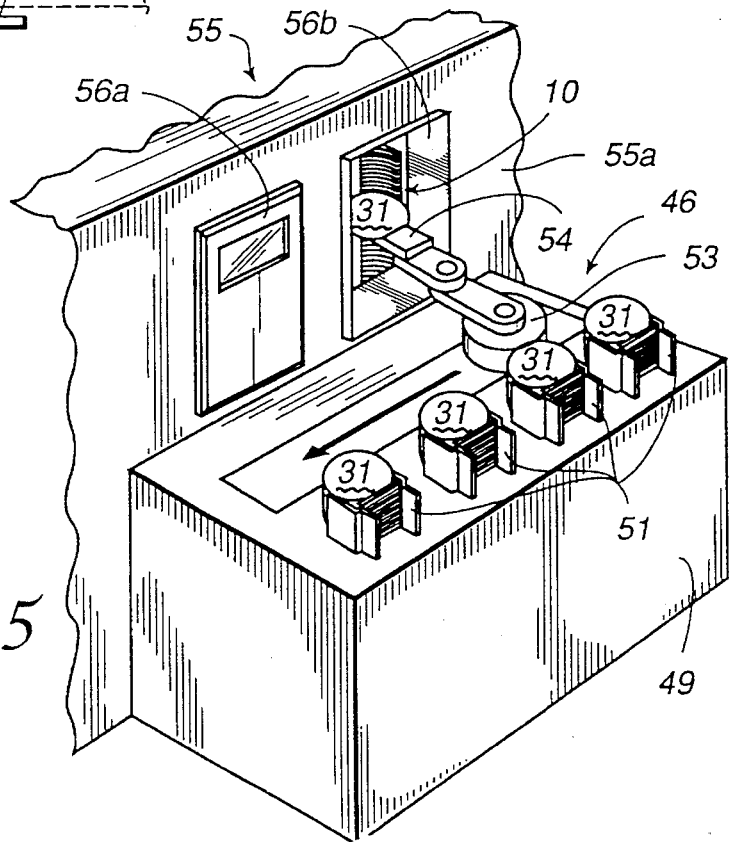
Figure 5

SEMICONDUCTOR WAFER CASSETTE TRANSFER SYSTEM

This application is a continuation of U.S. application Ser. No. 08/004,331, filed Jan. 14, 1993 now U.S. Pat. No. 5,387,067.

BACKGROUND OF THE INVENTION

1. Field of the Invention

This invention relates to a semiconductor wafer cassette and wafer transfer system for the temporary storage and transfer of semiconductor wafers during the manufacturing process; and more particularly, to a semiconductor wafer cassette apparatus and associated transfer system which is capable of directly loading and unloading wafers into the cassette from different sides using a first robot handling means having a wafer transfer blade movable along a first extension path and a second robot handling means having a second wafer transfer blade movable along a second extension path intersecting the first extension path at an acute angle and at a predetermined point concurrent with the cassette's wafer position centerline.

2. Description of the Prior Art

In the manufacture of semiconductor wafers, a plurality of wafers are temporarily stored and transferred between manufacturing and processing apparatus locations in factory cassettes. At the processing apparatus location, the factory cassette is either manually or automatically loaded into a loadlock chamber of the processing apparatus wherefrom the wafers may be unloaded for processing, or a factory robot unloads the wafers individually from the factory cassette and loads them into a fixed temporary storage cassette positioned in the loadlock chamber.

In the former case, where the factory cassette is manually loaded, the cassette is typically accessible from one side only and is oriented so that the system robot can access the wafer directly along an extension path directed perpendicular to the accessible side of the cassette. In the latter case, where a factory robot loads and unloads individual wafers between a factory cassette and a fixed cassette positioned in the loadlock chamber, the cassette is accessible from different sides, i.e., it is a "pass-through" cassette. As such, the pass-through cassette can be directly accessed by both the factory robot and the system robot if both robots are disposed in a position such that the extension path of each robot arm is along a common axis directed perpendicular to the accessible sides of the pass-through cassette.

The pass-through type of cassette is preferred over the cassettes having only one accessible side because it enables efficient robotic wafer handling, both inside and outside of the processing apparatus.

Also preferred for processing efficiency is a processing apparatus having a plurality of loadlock chambers for accommodating simultaneous loading/unloading operations by both the factory robot and the system robot. In this case, multiple loadlock chambers are positioned about a generally cylindrical, (multi-faced) wafer transfer chamber having a "simple" R-theta type robot (i.e., a robot having two degrees of freedom, one in extension/retraction and one in rotation) disposed therein. A simple R-theta robot is preferred so that it can rotate and load/unload wafers from any processing chamber disposed about the periphery of the transfer chamber.

However, to incorporate a pass-through cassette with this type of multiple loadlock system where the load/unload path is perpendicular to the accessible side of the cassette, requires a more sophisticated system robot having a particular type of articulated arm so that it can move laterally to position the robot arm along the path perpendicular to the accessible side of the pass-through cassette and extend/retract for loading/unloading of the wafers. Such a robot is more expensive, more complicated and less reliable than a simple R-theta robot that does not have this type of articulated arm. Therefore, a need has arisen in the art so that a simple R-theta robot can be used with a pass-through cassette disposed within multiple loadlock chambers.

One solution to this problem is to provide a means for orienting the pass-through cassette once loaded, i.e., rotate the cassette, so that it can be accessed on one side along the extension path of the R-theta robot and on the other side along the extension path of the factory robot. However, providing such an orientation means adds undesirable complexity and cost to the system.

Thus, it would be desirable to provide a semiconductor wafer transfer system which includes a pass-through-type wafer cassette disposed within a plurality of loadlock chambers positioned about the periphery of a generally circular transfer chamber having an R-theta robot(without articulated arm), and which can be directly loaded/unloaded from one side by a factory robot and from a different side by a system R-theta robot, the two robots having extension paths intersecting at an acute angle.

SUMMARY OF THE INVENTION

In accordance with the present invention, a semiconductor wafer cassette is provided for the temporary storage of one or more semiconductor wafers. The cassette can be loaded/unloaded by a first robot blade moveable in a first direction between two wafer supports, and loaded/unloaded by a second robot blade moveable in a second direction, said first and second directions intersecting at an acute angle at the center of the cassette. The cassette is comprised of a pair of wafer supports having shelves thereon for supporting a plurality of wafers, the pair of supports distanced and placed such that wafers are supported and the robot blades can be inserted between them for loading and unloading wafers.

The cassette is useful in combination with one or more loadlock chambers in a wafer processing system. The loadlock chamber has an opening for access by the first robot blade, and a second opening for access by a system robot that can unload wafers from the cassette and transfer them to one or more processing chambers, and reload the wafers into the cassette. The first robot blade can unload the processed wafers from the system.

The cassettes of the invention are advantageous because they can be employed with a factory robot external to the wafer processing system, and a simple R-theta system robot, avoiding the need for elaborate and more expensie articulated arm robots.

A further advantage of the cassettes of the invention comprises supporting shelves which have stepped edges for handling wafers of different sizes and for retention of wafers that are slightly misaligned with respect to the robot blades. The supporting steps maintain the position of the wafers and eliminate the need to provide precise and expensive wafer center-finding equipment prior to loading/unloading wafers. Further, the robot blades can also be fitted with a like series of stepped edges which reduce the amount of wafer movement possible during loading/unloading operations, even if the wafer is misaligned with respect to the blade.

DESCRIPTION OF THE DRAWINGS

In the accompanying drawings,

FIG. 2 is a plan view showing one of the two wafer supports of the cassette depicted in FIG. 1;

FIG. 3 is a partial cross-section taken along the line 3—3 of FIG. 2 and illustrating the support shelf configuration;

FIG. 4 is a side elevational view of a wafer support looking in the direction of the arrows 4—4 in FIG. 1;

FIG. 5 is a partially broken perspective view showing one side of a semiconductor wafer cassette and wafer processing apparatus in accordance with the present invention;

DETAILED DESCRIPTION OF THE PREFERRED EMBODIMENTS

Figure 1:
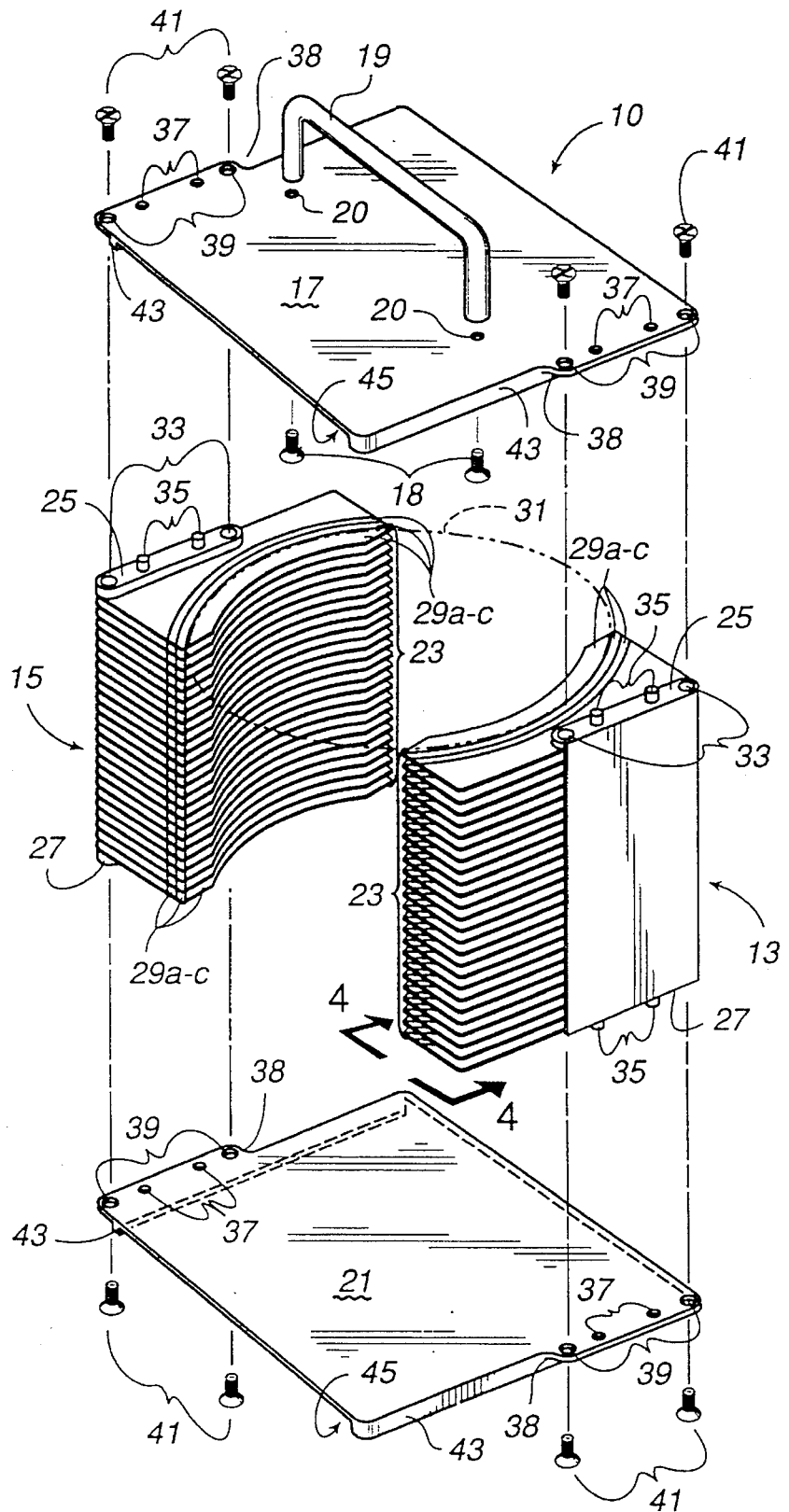
FIG. 1 is an exploded perspective view showing a wafer cassette in accordance with this invention.

In FIG. 1 of the accompanying drawing, the cassette ("pass-through cassette") 10 of this invention is shown in exploded perspective view, comprising a first wafer support 13, a second wafer support 15, a top plate 17 including an optionally attachable carrying handle 19, and a bottom plate 21. All of these individual parts are preferably made of a metal alloy, but may also be made of formed plastic.

Both the first and second wafer supports 13 and 15 of this invention include a plurality of integrally formed wafer support shelves 23, raised mounting shoulders 25 and downwardly extending mounting feet 27. Each wafer support shelf 23 includes a series of integrally formed steps ("stepped shoulders") 29a–c for the positioning and retention of individual wafers 31 thereon. Each of the shoulders 25 and feet 27 have drilled, threaded holes 33 and alignment dowels 35 for proper alignment and attachment to outwardly extending fastening extensions 38 of the top and bottom plates 17 and 21. Each extension is provided with drilled dowel alignment holes 37 and fastening holes 39.

Plates 17 and 21 also include integrally formed downwardly extending ribs 43 that serve as standoffs and provide underside clearance 45 when the plates 17 and 21 are fastened to the wafer supports 13 and 15. Plates 17 and 21 are fastened to the wafer supports 13 and 15 by flush mounting screws 41.

In addition, if the optional carrying handle 19 is to be fastened to the top plate 17, positioning holes 20 are drilled through the top plate 17 and the carry handle 19 is attached by flush mounting screws 18.

In FIG. 2 of the accompanying drawings, there is shown a plan view of the second wafer support 15 shown in FIG. 1. It should be noted that the first wafer support 13 is substantially identical in configuration to the second wafer support 15 illustrated in FIG. 2. Thus, for purposes of illustration of this invention, the first wafer support 13 is not shown in the same individual detail herein.

Figure 7:
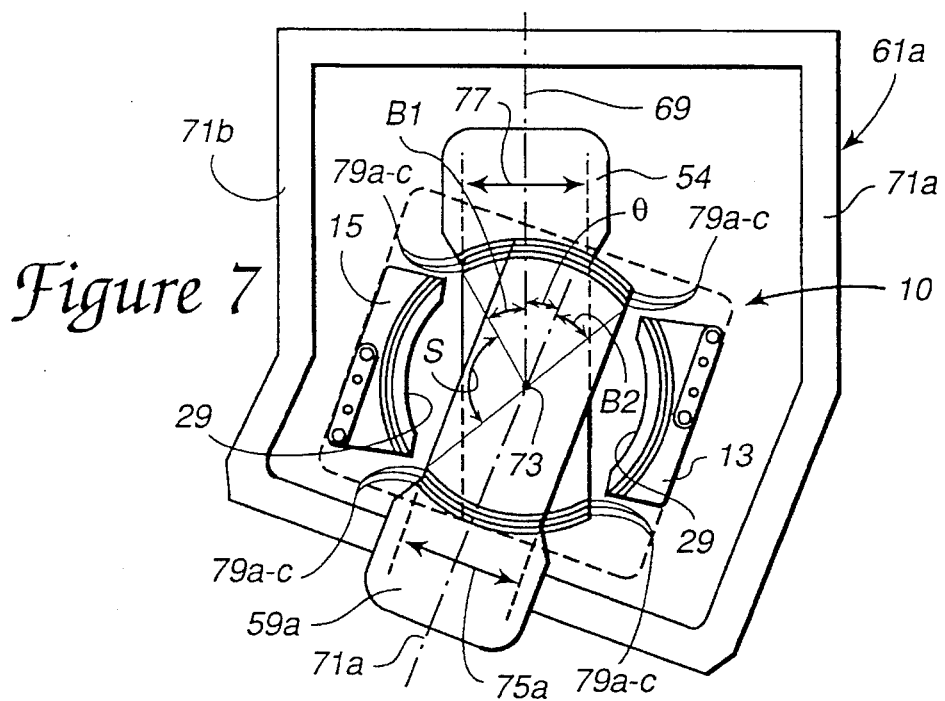
FIG. 7 is an enlarged plan view further illustrating one of two loadlock chambers of FIG. 6 illustrating the relationship of size and positioning of the wafer support means to the intersection point of the extension path axes of the first and second robots and the centerpoints of the robot blades.

Referring now additionally to FIG. 7, the position and arcuate shelf lengths of the wafer supports 13 and 15 depend upon the known diameter 32 of the wafer 31 to be loaded onto the wafer support shelves 23, the known widths 75a and 77 of the wafer-carrying blades 59a and 54, and the intersection angle θ of the axes 69 and 71a of the extension travel paths of the wafer carryingblades 54 and 59a. The arcuate lengths of the shelves 29 are dimensioned sot hat the supports do not interfere with the blades 59a and 54 when they are extended during the loading and unloading of the cassette 10. As may be geometrically determined from the layout depicted in FIG. 7, the arcuate shelves 29 must be configured to subtend angles "S" of less than $$S = 180° - \theta - \arcsin\left(\frac{W_1}{2r}\right) - \arcsin\left(\frac{W_2}{2r}\right)$$

where

θ is the angle of intersection of the axes 69 and 71a, $W_1$ is the width 77 of blade 54, $W_2$ is the width 75a of blade 59a, and r is the radius of a wafer to be loaded into cassette 10.

As shown in FIG. 2, the inner edge 47 of the wafer support shelf 23 and the shoulders forming wafer support steps 29a, 29b and 29a are arcuately formed to be concentric with the circumference of a particular size of wafer having a diameter 32. Innermost step 29a is of a dimension to support the wafer 31 in its centered position, as illustrated in FIG. 2. In the event, however, that a wafer 31 is not centrally loaded within the cassette 10, the wafer 31 can still be supported by the innermost step 29a and either step 29b or 29a, depending on how far offset the wafer 31 is from the center of the cassette 10 when it is loaded.

In FIG. 3, a partial cross-section of the wafer support of FIG. 2 is depicted looking in the direction of the arrows 3—3. For purposes of illustration, only the two uppermost wafer support shelves 23 are shown in cross-section, all of the other wafer support shelves 23 of the second wafer support 15 being of identical design. Each wafer support includes a riser 26 from which the support shelves extend. The riser and plurality of shelves can be formed of a combination of parts or can be machined or otherwise crafted from a single body of material. As indicated, each shelf includes wafer support steps 29a, 29b and 29c. A centered wafer will rest upon the first step 29a as indicated by the dashed lines 31a, while a slightly off-centered wafer, such as that represented by the dashed lines 31b, might rest on the step 29b. In either case, further lateral movement away from the centered position will be restrained by engagement of the wafer edge with a step riser.

Thus, it can be seen that a wafer 31 can be substantially off-center when loaded into the cassette be and yet be supported and restrained from movement away from the central position. In fact, movement or vibration of the cassette will tend to cause the wafer to move toward the centered position as it slips from one step to another. This feature thus reduces and/or eliminates the need for any precise wafer centering prior to loading of the cassette.

In FIG. 4 of the accompanying drawing, a side elevational view of wafer support 13 is shown looking in the direction of the arrows 4—4 of FIG. 1. FIG. 4. illustrates the unitary construction of the wafer supports, including the plurality of identically formed wafer support shelves 23, a riser 26 terminating at the top in a raised mounting shoulder 25 and at the bottom in a downward extending mounting foot 27, and alignment dowels 35.

In FIG. 5. of the accompanying drawings, there is partially shown in broken perspective a portion of the semiconductor wafer support and transfer system 46 of this invention and a wafer processing apparatus 55. particularly, FIG. 5 illustrates a first robot means ("factory robot") 53 which is positioned in an ambient environment between a row of factory cassettes 51 supported on a housing extension 49 and the outer perimeter wall 55a of the processing apparatus 55. The factory cassettes 51 each contain a plurality of wafers accessible for loading/unloading by factory robot 53. The factory robot 53 is capable of linear movement in the direction of arrow 53a which is substantially parallel to the supply row of factory cassettes 51 and the perimeter wall 55a of the processing apparatus 55. The processing apparatus 55 includes dual loadlock access ports 56a and 56b through which the factory robot 53 loads and/or unloads the cassette 10 of the invention disposed within the loadlock chambers 61a and 61b (see FIG. 6). The factory robot 53 is shown inserting a wafer 31 through the open port 56b into loadlock chamber 61b (FIG. 6) for transfer to the cassette 10.

Figure 6:
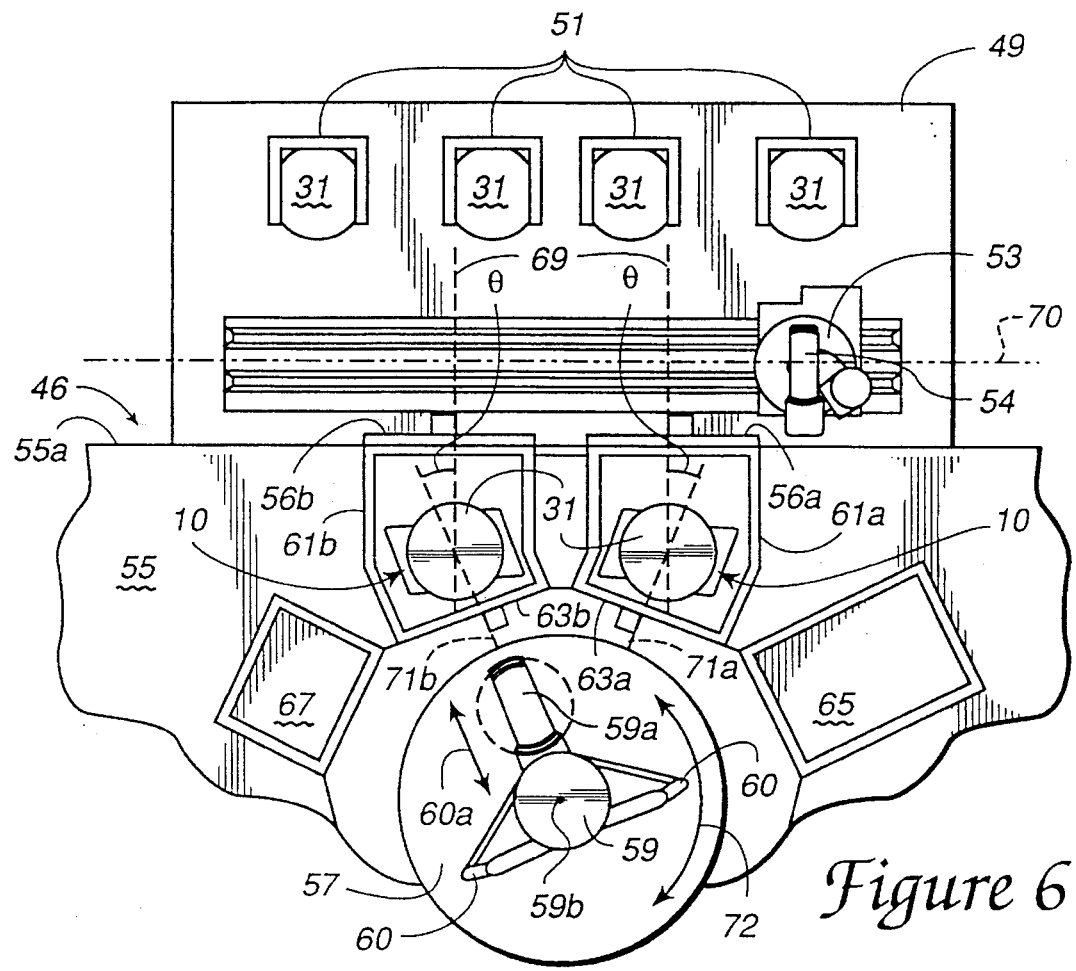
FIG. 6 is a partially broken plan view further depicting the cassette and transfer system and wafer processing apparatus, including a plurality of load lock chambers, as partially shown in FIG. 5.

Referring now to FIG. 6, a partially broken plan View of the wafer support and transfer system 46 of this invention and the processing apparatus 55. Factory robot 53 is shown unloaded with its wafer support blade 54 in a retracted position.

The apparatus 55 includes a low pressure central wafer transfer chamber 57 and an R-theta system robot 59 positioned therein. First and second wafer loadlock chambers 61a and 61b are positioned about the periphery of chamber 57, and first and second cassettes 10 are respectively positioned in first and second loadlock chambers 61a and 61b. A pair of wafer processing chambers 65 and 67 are also shown located about the periphery of chamber 57. The R-theta robot 59 rotates about its centerpoint 59b in the direction of the arrow 72 and includes arms 60 which carry the wafer support blade 59a and extend and retract it radially, in the direction of the arrows 60a, for loading and unloading the wafers 31 to and from the cassettes 31 and chambers 65 and Also illustrated in FIG. 6 is the linear travel path axis 70 and lateral extension path axes 69 of the factory robot 53. The factory robot's extension axes 69 are substantially normal to the robot's linear travel axis 70 and the loadlock chamber access ports, 56a and 56b. The inner sides 63a and 63b of loadlock chambers 61a and 61b (comprising an access way between loadlock chambers 61a and 61b and the central transfer chamber 57 along R-theta system robot extension pathways) are oriented substantially tangential to the central position of the R-theta system robot 59 and transverse to the system robots extension path axes 71a and 71b.

It can also be seen that the wafer support and transfer system 46 of this invention comprising the factory robot the R-theta robot 59, and the cassettes 10 disposed within loadlock chambers 61a and 61b, differs from the prior art methods by permitting the direct loading and/or unloading of wafers 31 along robot extension paths 69, 71a and 71b which intersect at an acute angle θ.

In FIG. 7 of the accompanying drawings, there is shown for illustration purposes an enlarged plan view of the loadlock chamber 61a of FIG. 6 with the cassette 10 therein, and both the factory robot wafer support blade 54 and the R-theta system robot wafer support blade 59a shown in their extended (loading and unloading) positions.

The wafer supports 13 and 15 of the cassette 10 are positioned in loadlock chamber 61a so that the centerpoint of the cassette 10 is concurrent with the wafer position centerpoints 75 of the robot blades 54 and 59a. The centerpoint 73 also corresponds with the point of intersection of the factory robot extension axis 69 and the R-theta system robot extension axis 71a. In addition, the wafer supports 13 and 15 are oriented so that the robot blades 54 and 59, when at their extended position as shown, do not strike the wafer support shelves 23 (FIG. 1) of the wafer supports 13 and 15 during wafer loading and/or unloading from either side of the cassette As shown, the blades 59a and 54 also have wafer support steps 79a–c ("stepped shoulders") like those of the wafer support shelves 23 of the wafer supports 13 and 15 for the purpose of limiting the movement of wafers 31 during loading and unloading.

The position of cassette 10 (and the locations of wafer supports 13 and 15) in the loadlock chamber 61a is determined by the point of intersection 73 of the extension axes 69 and 71a of the blades 54 and 59a and the acute angle θ formed thereby. The loadlock chambers may be of any design configuration subject to the limitation that there be sufficient travel clearance between the side walls 71a and 71b and the wafer as it is loaded and unloaded from the cassette 10 by the factory and system robot blades 54 and 59a.

Thus the present invention is also advantageous in that it can be readily retrofit to existing wafer processing apparatus with little expense.

While the invention has been particularly shown and described with reference to certain preferred embodiments, it will be understood by those skilled in the art that various alterations and modifications in form and in detail may be made therein. Accordingly, it is intended that the following claims cover all such alterations and modifications as may fall within the true spirit and scope of the invention.

What is claimed is:

1. A system for storing and transferring a planar substrate having a primary plane and a primary width, the system comprising:

(a) a substrate storage;

(b) a first substrate transfer means, having a maximum first width $W_1$ which is less than the primary width of the substrate and means for constraining movement of the substrate, for transferring the substrate along a first transfer axis associated with the substrate storage, to or from the substrate storage;

(c) a second substrate transfer means, having a maximum second width $W_2$ which is less than the primary width of the substrate, for transferring the substrate along a second transfer axis non-parallel to the first transfer axis and associated with the substrate storage, to or from the substrate storage; and (d) first and second substrate edge supports associated with the substrate storage and for supporting the substrate at its edges, the first and second substrate edge supports being arranged to permit transfer of the substrate to or from the substrate storage by both the first and second substrate transfer means in a rectilinear manner without the substrate storage being rotated about an axis perpendicular to the primary plane of the substrate.

2. A system as recited in claim 1, wherein the first and second substrate transfer means each include a blade having a substantially planar characteristic.

3. A system as recited in claim 2, wherein both the first and second substrate edge supports have respective proximal and respect to the first transfer means; and wherein the first and second edge supports are disposed in positions relative to each other to permit passage of both the first and second transfer blades between both the proximal edges and both the distal edges.

4. A system as recited in claim 3, wherein each substrate support defines an interior angle between lines drawn from its proximal and distal edges to and terminating at an intersection between the first and second transfer axes, such that the interior angle is no greater than an angle S, with $$S = 180° - \theta - \arcsin\frac{(W_1)}{2r} - \arcsin\frac{(W_2)}{2r}$$

where $\theta$ is the angle of intersection between the first and second transfer axes and r is a radius of the substrate being transferred.

5. A system as recited in claim 4, wherein the first and second substrate transfer means are operable to transfer substrates in respective transfer planes which are parallel or coplanar.

6. A system as recited in claim 5, wherein the transfer planes are horizontal and parallel to the primary plane of the substrate stored in the cassette.

7. A system as recited in claim 6, wherein said substrate storage is disposed within a loadlock chamber.

8. A system as recited in claim 7, wherein said first substrate transfer means is disposed in an ambient environment and said second substrate transfer means is disposed within a low pressure environment, passage between said environments being facilitated by said loadlock chamber.

9. A system as recited in claim 8, wherein said low pressure environment is maintained within a walled chamber having connected about its periphery at least one said loadlock chamber and a plurality of substrate processing chambers.

10. A system as recited in claim 9, wherein said first and second substrate edge supports include arcuate shelves for supporting the respective edge portions of said substrates.

11. A system as recited in claim 10, wherein said first and second substrate edge supports further include a plurality of stepped formations.

12. A system as recited in claim 11, wherein said means for constraining movement of the substrate includes stepped formations.

13. A system as recited in claim 4, comprising at least two of the substrate storages arranged such that planes, perpendicular to the primary plane of the substrate received in each substrate storage and passing through their respective associated second transfer axes, intersect at an axis of rotation about which the second transfer means rotates during transfer of substrates to and from the substrate storages.

14. A system as recited in claim 1, further comprising a primary substrate storage, arranged to permit transfer of substrates between the primary substrate storage and the substrate storage.

15. A system as recited in claim 14, wherein the first substrate transfer means is operable to move along a path, transverse to the first transfer axis, between the primary substrate storage device and the substrate storage.

16. A system as recited in claim 15, further comprising a substrate storage raising and lowering mechanism for raising and lowering the substrate storage in a direction substantially perpendicular to the primary plane of the substrate stored in the substrate storage.

17. A system as recited in claim 16, wherein the first and second substrate transfer means each include a substrate transfer blade of known maximum width $W_1$ and $W_2$, respectively.

18. A system as recited in claim 17, wherein both the first and second substrate edge supports have respective proximal and distal edges with respect to the first transfer means; and wherein the first and second edge supports are disposed in positions relative to each other to permit passage of both the first and second transfer blades between both the proximal edges and both the distal edges.

19. A system as recited in claim 18, wherein each substrate support defines an interior angle between lines drawn from its proximal and distal edges to and terminating at an intersection between the first and second transfer axes, such that the interior angle is no greater than an angle S, with $$S = 180° - \theta - \arcsin\frac{(W_1)}{2r} - \arcsin\frac{(W_2)}{2r}$$

where $\theta$ is the angle of intersection between the first and second transfer axes and r is a radius of the substrate being transferred.

20. A substrate storage which may be loaded or unloaded by a first transfer blade having a maximum first width $W_1$ and means for constraining movement of a substrate, and a second transfer blade having a maximum second width $W_2$, the substrate storage comprising:

(a) a first substrate edge support for supporting a first edge of the substrate, the substrate having a major dimension greater than either $W_1$ or $W_2$;

(b) a second substrate edge support for supporting a second edge of the substrate and disposed relative to the first substrate edge support to define first and second loading ports, through which both first and second transfer blades can pass in a rectilinear manner along first and second axes respectively, to load the substrate into or unload the substrate from the substrate storage, the second axis intersecting the first axis at an intersection point at an acute angle $\theta$;

whereby the substrate storage may be accessed by first and second transfer blades without rotating the substrate storage.

21. A substrate storage as recited in claim 20, wherein the first and second substrate edge supports each include a proximal and a distal edge with respect to a loading direction along which the substrate is loaded into the substrate storage; and wherein the first loading port is defined between the proximal edges of the first and the second substrate edge supports respectively and the second loading port is defined between the distal edges of the first and the second substrate edge supports respectively.

22. A substrate storage as recited in claim 21, wherein each substrate edge support is configured to define as interior angle, between lines drawn from its proximal and distal edges to the intersection point, no greater than an angle S, with $$S = 180° - \theta - \arcsin\frac{(W_1)}{2r} - \arcsin\frac{(W_2)}{2r}$$

where r is the maximum distance from the intersection point to the proximal or distal edge of the substrate edge support.

23. A substrate storage as recited in claim 22, wherein the substrate is circular and r is a radius of the substrate, and wherein said first and second substrate edge supports define arcuate supports for receiving the respective edges of the substrate.

24. A substrate storage as recited in claim 23, wherein first and second edge supports include a stepped formation.

\* \* \* \* \*